(12) United States Patent
Rahman

(10) Patent No.: US 8,082,537 B1
(45) Date of Patent: Dec. 20, 2011

(54) METHOD AND APPARATUS FOR IMPLEMENTING SPATIALLY PROGRAMMABLE THROUGH DIE VIAS IN AN INTEGRATED CIRCUIT

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 341 days.

(21) Appl. No.: 12/361,115

(22) Filed: Jan. 28, 2009

(51) Int. Cl.
*G06F 17/50* (2006.01)
*H01L 29/06* (2006.01)
*H01L 29/40* (2006.01)

(52) U.S. Cl. ............ 716/137; 716/51; 716/52; 716/53; 716/54; 716/55; 716/138; 716/139; 257/618; 257/737; 257/774; 257/777

(58) Field of Classification Search ............ 716/51–55, 716/137–139; 257/618, 621, 737, 774, 777
See application file for complete search history.

(56) References Cited

U.S. PATENT DOCUMENTS

| | | | |
|---|---|---|---|
| 5,157,618 A * | 10/1992 | Ravindra et al. ............ | 716/50 |
| 5,399,898 A | 3/1995 | Rostoker | |
| 5,682,062 A | 10/1997 | Gaul | |
| 5,917,709 A * | 6/1999 | Johnson et al. ............ | 361/803 |
| 5,995,379 A | 11/1999 | Kyougoku et al. | |
| 6,150,724 A * | 11/2000 | Wenzel et al. ............ | 257/777 |
| 6,577,013 B1 | 6/2003 | Glenn et al. | |
| 6,882,045 B2 * | 4/2005 | Massingill et al. ............ | 257/724 |
| 6,903,443 B2 | 6/2005 | Farnworth et al. | |
| 7,068,072 B2 | 6/2006 | New et al. | |
| 7,276,799 B2 | 10/2007 | Lee et al. | |
| 7,323,771 B2 * | 1/2008 | Fujita et al. ............ | 257/691 |
| 7,367,503 B2 * | 5/2008 | Harai et al. ............ | 235/441 |
| 7,412,668 B1 * | 8/2008 | Duong ............ | 716/108 |
| 7,435,910 B2 * | 10/2008 | Sakamoto et al. ............ | 174/260 |
| 7,466,028 B1 * | 12/2008 | Yu et al. ............ | 257/774 |
| 7,518,398 B1 | 4/2009 | Rahman et al. | |
| 7,538,033 B2 * | 5/2009 | Trezza ............ | 438/667 |
| 7,557,367 B2 * | 7/2009 | Rogers et al. ............ | 257/9 |
| 7,605,458 B1 | 10/2009 | Rahman et al. | |
| 7,619,441 B1 | 11/2009 | Rahman et al. | |
| 7,765,686 B2 * | 8/2010 | Murakami et al. ............ | 29/831 |
| 7,838,997 B2 * | 11/2010 | Trezza ............ | 257/778 |

(Continued)

OTHER PUBLICATIONS

U.S. Appl. No. 11/973,062, filed Oct. 4, 2007, Rahman et al.

(Continued)

*Primary Examiner* — Helen Rossoshek
(74) *Attorney, Agent, or Firm* — Robert M. Bush; Raymond Moser; Gerald Chan

(57) ABSTRACT

Examples of the invention relate to a method, apparatus, and computer readable medium for designing a mother integrated circuit (IC) configured for stacking with at least one daughter IC. A layout of the mother IC includes at least one interface tile having an electrical configuration for communicating with interface logic of the daughter IC. The method includes: obtaining design rules for through die vias (TDVs) to be formed in the mother IC for implementing connections between the at least one interface tile and a physical interface of the daughter IC; defining a layout of the TDVs in the mother IC according to the design rules; and defining at least one mask for programming interconnect on the mother IC to physically connect the TDVs between the at least one interface tile and the physical interface of the daughter IC without changing the electrical configuration of the at least one interface tile.

20 Claims, 5 Drawing Sheets

U.S. PATENT DOCUMENTS

| | | | |
|---|---|---|---|
| 7,904,864 B2 * | 3/2011 | Huynh et al. | 716/122 |
| 2002/0139577 A1 | 10/2002 | Miller | |
| 2004/0061238 A1 | 4/2004 | Sekine | |
| 2008/0150088 A1 * | 6/2008 | Reed et al. | 257/621 |
| 2009/0020855 A1 | 1/2009 | Pyeon | |
| 2009/0230552 A1 * | 9/2009 | Pendse | 257/737 |
| 2009/0319968 A1 * | 12/2009 | Wang et al. | 716/5 |
| 2009/0321947 A1 | 12/2009 | Pratt | |
| 2010/0259296 A1 * | 10/2010 | Or-Bach | 326/38 |
| 2010/0270597 A1 * | 10/2010 | Sproch et al. | 257/255 |
| 2010/0289124 A1 * | 11/2010 | Nuzzo et al. | 257/618 |
| 2011/0018573 A1 * | 1/2011 | Hamada et al. | 324/762.01 |
| 2011/0036396 A1 * | 2/2011 | Jayaraman et al. | 136/255 |

OTHER PUBLICATIONS

U.S. Appl. No. 12/361,827, filed Jan. 29, 2009, Rahman.
U.S. Appl. No. 12/392,065, filed Feb. 24, 2009, Rahman.

* cited by examiner and

METHOD AND APPARATUS FOR IMPLEMENTING SPATIALLY PROGRAMMABLE THROUGH DIE VIAS IN AN INTEGRATED CIRCUIT

FIELD OF THE INVENTION

One or more aspects of the present invention relate generally to semiconductor devices and, more particularly, to a method and apparatus for implementing spatially programmable through-die vias (TDVs) in an integrated circuit (IC).

BACKGROUND OF THE INVENTION

As semiconductor technology has advanced, the amount and speed of logic available on an IC, such as an FPGA, has increased more rapidly than the number and performance of I/O connections. As a result, IC die stacking techniques have received renewed interest to address the interconnection bottleneck of high-performance systems. In stacked IC applications, two or more ICs are stacked vertically and interconnections are made between them. Such a stacked arrangement is referred to as a system-in-package (SIP).

Through die vias (TDVs) can be employed to establish interconnections between stacked ICs (also referred to as through silicon vias (TSVs)). A TDV is a metal via that extends through a die of one IC for coupling to interconnect of another IC. In the design of stacking-friendly ICs, regions in the device layout are dedicated to TDVs. In a typical stacked arrangement, a "daughter" IC is mounted on a "mother" IC. Depending on the source of the daughter IC, the die stacking-related integration (e.g., TDV formation, micro-bumping, and bonding) can be implemented either in the fabrication house (e.g., mother and/or daughter IC manufacturer) or in the assembly house (e.g., a separate facility for mounting a previously manufactured daughter IC to a previously manufactured mother IC). Typically, the manufacturing capabilities for TDV formation (e.g., density, diameter, pitch, aspect ratio, etc.) in the fabrication house differ than those of the assembly house. Further, the daughter IC may have various inter-chip interface densities. As a result, the mother IC has to physically and functionally support different TDV and micro-bump configurations based on the particular inter-chip interface of the daughter IC and the manufacturing capabilities of the fabrication/assembly process. Re-designing the mother IC for different daughter ICs and/or different manufacturing processes is time-consuming and expensive.

Accordingly, there exists a need in the art for a stacking-friendly IC implementation that can be used for various daughter IC and manufacturing configurations.

SUMMARY OF THE INVENTION

Embodiments of the invention relate to a method, apparatus, and computer readable medium for designing a mother integrated circuit (IC) configured for stacking with at least one daughter IC. A layout of the mother IC includes at least one interface tile having an electrical configuration for communicating with interface logic of the daughter IC. The method includes: obtaining design rules for through die vias (TDVs) to be formed in the mother IC for implementing connections between the at least one interface tile and a physical interface of the daughter IC; defining a layout of the TDVs in the mother IC according to the design rules; and defining at least one mask for programming interconnect on the mother IC to physically connect the TDVs between the at least one interface tile and the physical interface of the daughter IC without changing the electrical configuration of the at least one interface tile.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1:
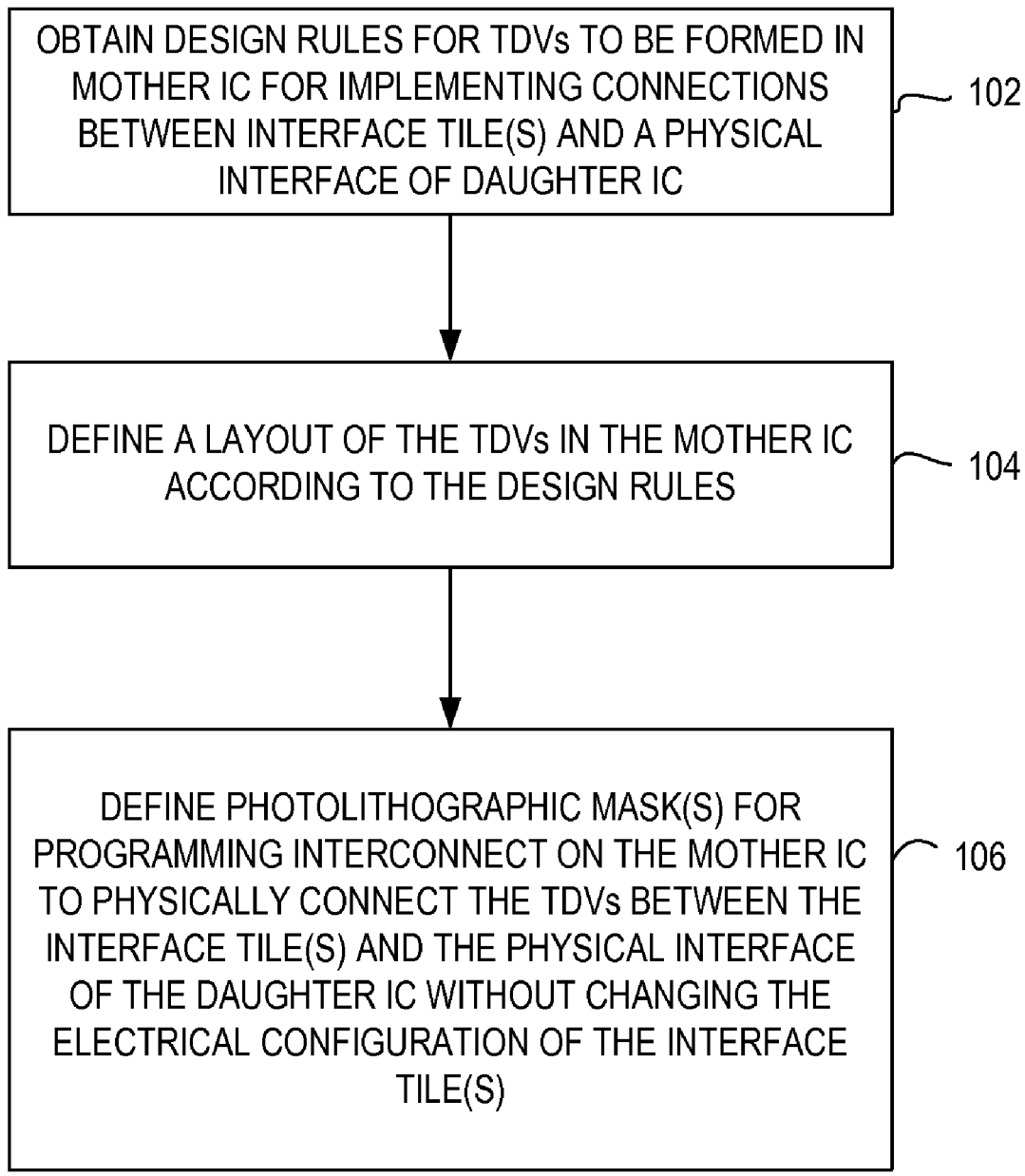
FIG. 1 is a flow diagram depicting a method of designing an integrated circuit (IC) configured for stacking according to some embodiments of the invention.

FIG. 1 is a flow diagram depicting a method 100 of designing an integrated circuit (IC) configured for stacking according to some embodiments of the invention. The method 100 may be understood with respect to a "mother IC" configured for stacking with a "daughter IC". Although aspects of the invention are described with respect to a single daughter IC stacked on a mother IC, the invention may also be employed in cases where the mother IC is configured for stacking with multiple daughter ICs. In the method 100, the mother IC includes at least one interface tile having an electrical configuration for communicating with interface logic of the daughter IC. Exemplary embodiments of an interface tile of the mother IC and the interface logic of the daughter IC are shown and described below. In general, an interface tile in the mother IC enables the mother IC to send signals to, and receive signals from, the daughter IC. The interface logic in the daughter IC facilitates sending signals to, and receiving signals from, the mother IC.

The method 100 begins at step 102, where design rules are obtained for through die vias (TDVs) to be formed in the mother IC for implementing connections between the interface tile(s) and a physical interface of the daughter IC. The "physical interface" of the daughter IC may include an array of contacts externally accessible on the daughter IC, such as lands, pads, bumps, solder balls, or the like. In the stacked arrangement, the daughter IC can be mounted to the backside of the mother IC. Thus, the mother IC includes TDVs for making connections between conductive interconnect on the active side of the mother IC (opposite the backside) and the physical interface of the daughter IC. The layout of the TDVs on the mother IC is at least partially dictated by design rules for the TDVs. The design rules can be established based on manufacturing process specifications, pin-out configuration of the daughter IC physical interface, or both. The "pin-out configuration" of the daughter IC physical interface refers to the number and spatial arrangement of the external contacts. Manufacturing process specifications may include limitations on density, diameter, pitch, aspect ratio, and the like for the formation of TDVs during fabrication and manufacture.

At step 104, a layout of TDVs in the mother IC is defined according to the design rules. The TDV layout can be affected by the manufacturing process specifications of the TDVs, the pin-out configuration of the daughter IC, or both. For example, as noted above, manufacturing process specifications may dictate density, diameter, pitch, aspect ratio, and the like of the TDVs. Thus, the number and/or spatial arrangement of TDVs in the mother IC can differ given different daughter ICs and/or different manufacturing processes to be used. However, as discussed below, functionality of the interface tile(s) in the mother IC can be the same and can accommodate various configurations of TDVs. Thus, while the TDV layout may be dependent on the design rules, the functionality of the interface tile(s) in the mother IC is not and can be fixed. As a result, the mother IC is portable and can be used with various daughter ICs and can be the target of different manufacturing processes without the need for substantial re-design of the interface tile(s).

At step 106, at least one photolithographic mask ("mask") is defined for programming interconnect on the mother IC to physically connect the TDVs between the interface tile(s) and the physical interface of the daughter IC without changing the electrical configuration of the interface tile(s). The electrical configuration of the interface tile(s) refers to functionality and/or data throughput. Thus, while the physical connections between the mother IC and the daughter IC may vary (e.g., TDV configuration), the electrical configuration of the interface tile(s) may be constant, which obviates the need to re-design the interface tile(s) for different daughter ICs and/or different target manufacturing processes. The interface tile(s) may be adapted to different TDV configurations by defining different interconnect masks for the mother IC. In other words, the interconnect of the mother IC can be mask-programmable to electrically couple the logic of the interface tile(s) to the particular layout of the TDVs as set forth in step 104. The mask(s) can be custom generated in response to any particular configuration of TDVs without changing the logic of the interface tile(s).

Figure 2:
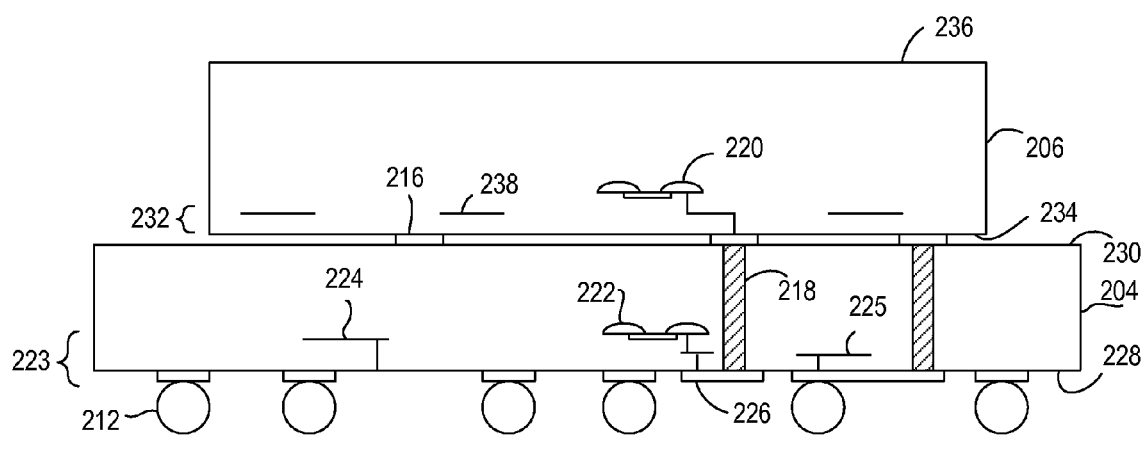
FIG. 2 is a cross-section of a semiconductor device according to some embodiments of the invention.

Aspects of the method 100 may be understood with respect to the following. FIG. 2 is a cross-section of a semiconductor device 200 according to some embodiments of the invention. The semiconductor device 200 includes a mother IC die 204 and a daughter IC die 206. The mother IC die 204 and the daughter IC die 206 may comprise any type of ICs known in the art. In some embodiments, the mother IC die 204 comprises a field programmable gate array (FPGA) and the daughter IC die 206 comprises any type of analog, digital, or mixed signal IC, such as a random access memory (RAM). Such embodiments, however, are just some of a myriad of possible combinations of known ICs.

The mother IC die 204 includes bump contacts 212 that provide an external interface (e.g., for mounting to a carrier substrate, printed circuit board, etc.). The mother IC die 204 includes conductive interconnect 223 electrically coupled to active circuitry (symbolized as element 222). The bump contacts 212, conductive interconnect 223, and the active circuitry 222 are formed on a face side 228 of the mother IC die 204. The side opposite the face side 228 is referred to as a backside 230 of the mother IC die 204.

The conductive interconnect 223 of the mother IC die 204 may include one or more conductive layers (e.g., metal and polysilicon layers). In the present example, conductive layers 224, 225, and 226 are shown. It is to be understood that the mother IC die 204 is merely exemplary and that a practical IC die typically includes more than two conductive layers (e.g., up to 12 conductive layers). The mother IC die 204 further includes through-die vias 218 (TDVs) extending between the backside 230 and conductive interconnect 223 on the face side 228 (e.g., vias extending through the die). The TDVs 218 are exposed at the backside 230 of the mother IC die 204.

The daughter IC die 206 includes inter-die contacts 216 electrically coupled to the exposed portions of the TDVs 218. The inter-die contacts 216 communicate electrical signals between the mother IC die 204 and the daughter IC die 206. In some embodiments, the inter-die contacts 216 may comprise micro-pads or like type contacts. The inter-die contacts 216 may have a pitch less than a pitch of the bump contacts 212. The daughter IC die 206 includes conductive interconnect 232 electrically coupled to active circuitry (symbolized as element 220). The inter-die contacts 216, the conductive interconnect 232, and the active circuitry 220 are formed on a face side 234 of the daughter IC die 206. The side opposite the face side 234 is a backside 236 of the daughter IC die 206. The conductive interconnect 232 of the daughter IC die 206 may include one or more conductive layers (e.g., metal and polysilicon layers). In the present example, a conductive layer 238 is shown. Again, It is to be understood that the daughter IC die 206 is merely exemplary and that a practical IC die typically includes more than two conductive layers (e.g., up to 12 conductive layers).

Referring to FIGS. 1 and 2, the active circuitry on the mother IC die 204 (e.g., element 222) can include interface tile(s), and the active circuitry of the daughter IC die 206 can include interface logic (e.g., element 220). The inter-die contacts 216 comprise the physical interface of the daughter IC die 206. The TDVs 218 provide connections between the interface tile(s) of the mother IC die 204 and the physical interface of the daughter IC die 206 (e.g., connections between 222 and 216). As discussed above with respect to steps 102 and 104, the layout of TDVs is dictated by associated design rules. The design rules can be established based on manufacturing specifications (e.g., limitations on density, pitch, aspect ratio, etc.), the physical configuration of the inter-die contacts 216, or both. As shown in FIG. 2, given a particular layout of the TDVs 218, the conductive interconnect 223 on the mother IC die 204 electrically connects the TDVs 218 to the appropriate active circuitry (e.g., interface tile(s). One or more layers of the conductive interconnect 223 (e.g., layers 224 and/or 226) can be mask-programmed to connect the TDVs 218 to the active circuitry of the interface tile(s) (e.g., element 222). Thus, different masks can be designed for different layouts of the TDVs 218 in order to couple the TDVs 218 to the appropriate active circuitry without changing the electrical configuration of such active circuitry.

In some embodiments, the mask-programmable interconnect for coupling the TDVs 218 to the appropriate active circuitry comprises one or more of the bottom-most layers of the conductive interconnect 223 (e.g., the layers nearest the active circuitry, such as M1, M2, etc.). Such embodiments are suitable for a "via-first" manufacturing process, whereby the TDVs are formed along with the mother IC after the front-end process is complete (e.g., active circuitry). In other embodiments, the mask-programmable interconnect for coupling the TDVs 218 to the appropriate active circuitry comprises one or more of the top-most layers of the conductive interconnect 223 (e.g., the layers farthest from the active circuitry, such as M11, M12, etc). Such embodiments are suitable for a "via-last" manufacturing process, whereby the TDVs are formed after the mother IC has been fabricated (e.g., after fabrication of active circuitry and interconnect on the mother IC). Thus, the mask-formation of the invention can adapt to either type of via-first or via-last manufacturing process.

Figure 3:
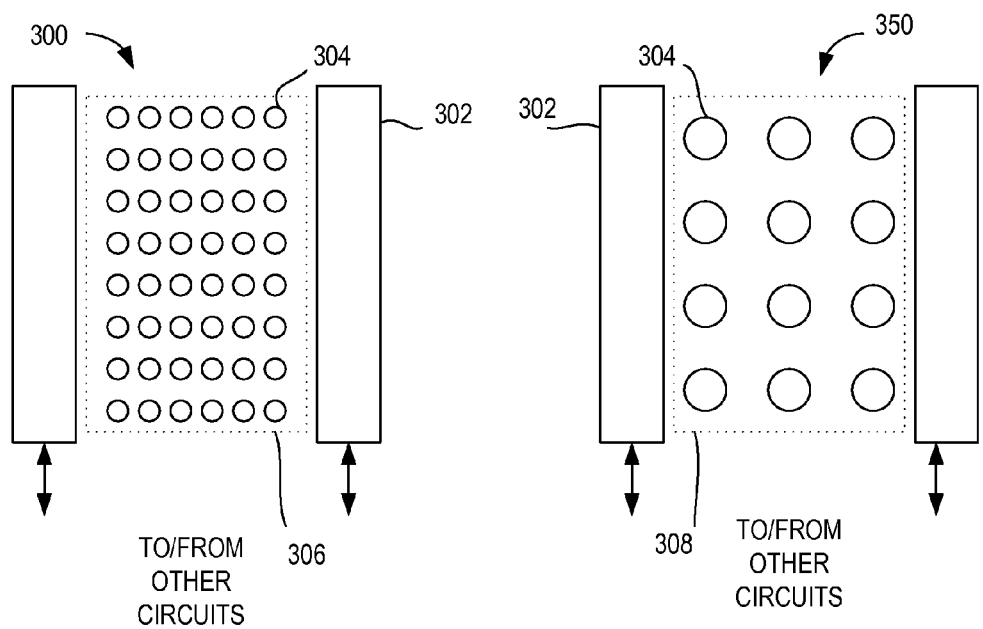
FIG. 3 is a block diagram depicting exemplary embodiments of interface tiles according to some embodiments of the invention.

FIG. 3 is a block diagram depicting exemplary embodiments of interface tiles 300 and 350 according to some embodiments of the invention. Each of the interface tiles 300 and 350 includes interface logic 302 and TDVs 304. The interface tile 300 includes a TDV layout 306 of the TDVs 304, and the interface tile 300 includes a TDV layout 308 of the TDVs 304. The TDVs 304 have a greater spatial density and lesser diameters in the TDV layout 306 than in the TDV layout 308. The interface logic 302 may include various circuits to facilitate communication between circuitry on a mother IC and circuitry on a daughter IC. Exemplary circuits in the interface logic 302 include voltage level translators, registers, multiplexer circuits, drivers, serializer/deserializer, switch matrix, and like type circuits known in the art. The interface logic 302 may communicate with other circuits on the mother IC (not shown). For example, if the mother IC is an FPGA, the interface logic 302 may communicate with the programmable fabric of the FPGA. The interface logic 302 is also coupled to the TDVs 304 for communicating with a daughter IC (exemplary connections shown in FIG. 2). As noted above, the TDVs 304 are spatially programmable in that the interface tile 300 can accommodate various layouts of the TDVs 304 (e.g., the layouts 306 and 308). The electrical configuration of the interface logic 302 is not changed across different layouts of the TDVs 304.

Figure 4:
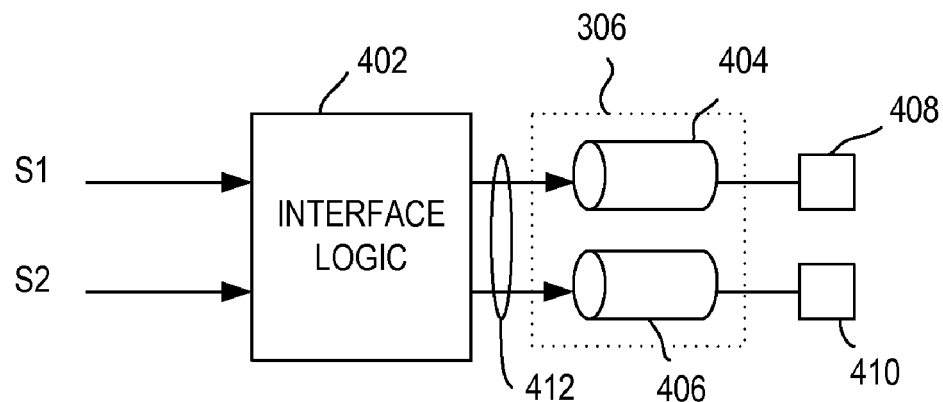
FIG. 4 is a block diagram depicting a more detailed portion of an interface tile in FIG. 3 according to some embodiments of the invention.

FIG. 4 is a block diagram depicting a more detailed portion 400 of the interface tile 300 according to some embodiments of the invention. The portion 400 includes interface logic 402 (part of the interface logic 302) coupled to TDVs 404 and 406 (part of the TDVs 304) in the TDV layout 306. The TDVs 404 and 406 are in turn coupled to inter-die contacts 408 and 410 that couple a daughter IC to a mother IC. The interface logic 402 is coupled to the TDVs 404 and 406 via mask-programmable interconnect 412 on the mother IC (e.g., part of the interconnect 223 shown in FIG. 2). In this exemplary embodiment, the interface logic 402 is configured to receive a pair of signals 51 and S2 from other circuits (not shown). The interface logic 402 couples the two signals 51 and S2 to the TDVs 404 and 406, respectively. In this manner, the interface logic 402 can provide the two signals 51 and S2 to the daughter IC. While the present example pertains to sending signals from the mother IC to the daughter IC, it is to be understood that the same configuration can be used to receive signals from the daughter IC at the mother IC.

Figure 5:
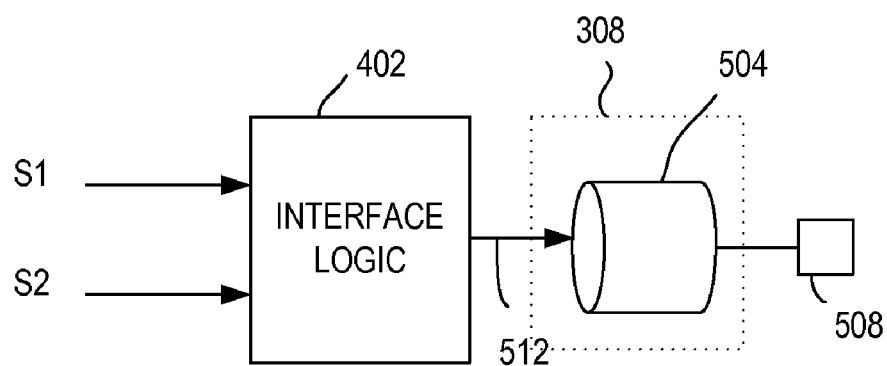
FIG. 5 is a block diagram depicting the portion of an interface tile shown in FIG. 3 having a different TDV layout according to some embodiments of the invention.

FIG. 5 is a block diagram depicting a portion 500 of the interface tile 350 according to some embodiments of the invention. The portion 500 includes the interface logic 402 (part of the interface logic 302) coupled to a TDV 504 (part of the TDVs 304) in the TDV layout 308. For example, manufacturing specifications may dictate TDVs having a larger diameter, resulting in lower TDV density in the interface tile 350 as opposed to the interface tile 300. The interface logic 402 is coupled to the TDV 504 via mask-programmable interconnect 512 on the mother IC (e.g., part of the interconnect 223 shown in FIG. 2). The TDV 504 is coupled to an inter-die contact 508 between the mother IC and the daughter IC.

The interface logic 402 still receives a pair of signals S1 and S1 from other circuitry (not shown). The interface logic 402 couples the two signals S1 and S1 to the TDV 504, which in turn provides the signals to the daughter IC. For example, the signals S1 and S2 may be multiplexed over the TDV 504. In order to provide the two signals over the TDV 504, the data throughput of the portion 500 would be half of the data throughput of the portion 400 shown in FIG. 4. In some embodiments, the data rate of the interface logic 402 can be increased in the portion 500 to maintain the same data throughput as the portion 400 shown in FIG. 4. The data rate of the interface logic 402 can be increased without changing the electrical configuration thereof. For example, to accommodate for less TDV density, the interface logic 402 can employ higher data rates (e.g., double-date rate (DDR), quad data rate (QDR), etc.) or employ higher clock frequencies to transmit the data faster. Accordingly, the electrical configuration of the interface logic 402 is maintained across the different TDV layouts 306 and 308. The only required change is a re-configuration of the mask-programmable interconnect 412 and 512.

Figure 6A:
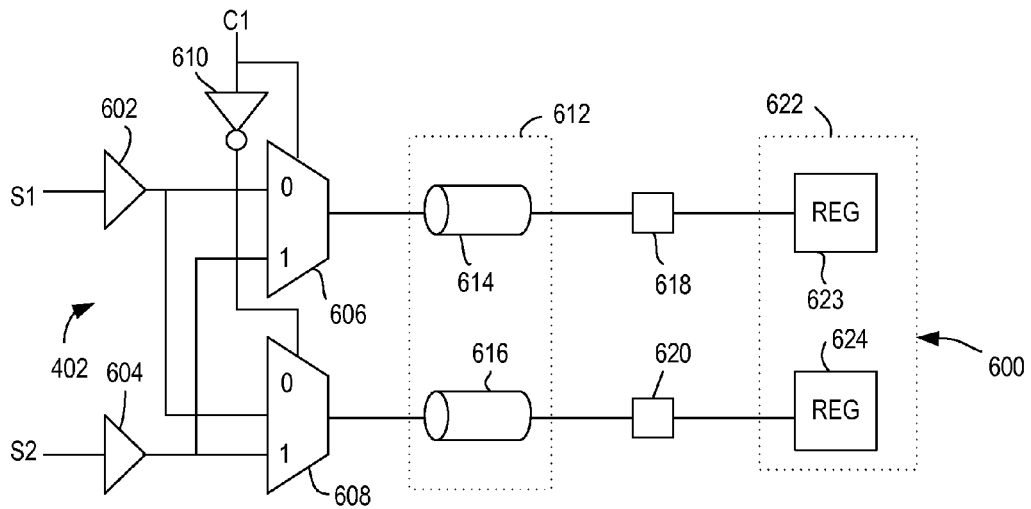
FIG. 6A is a block diagram showing one embodiment of interface logic with different TDV and inter-die contact configurations in stacked IC configuration.
Figure 6B:
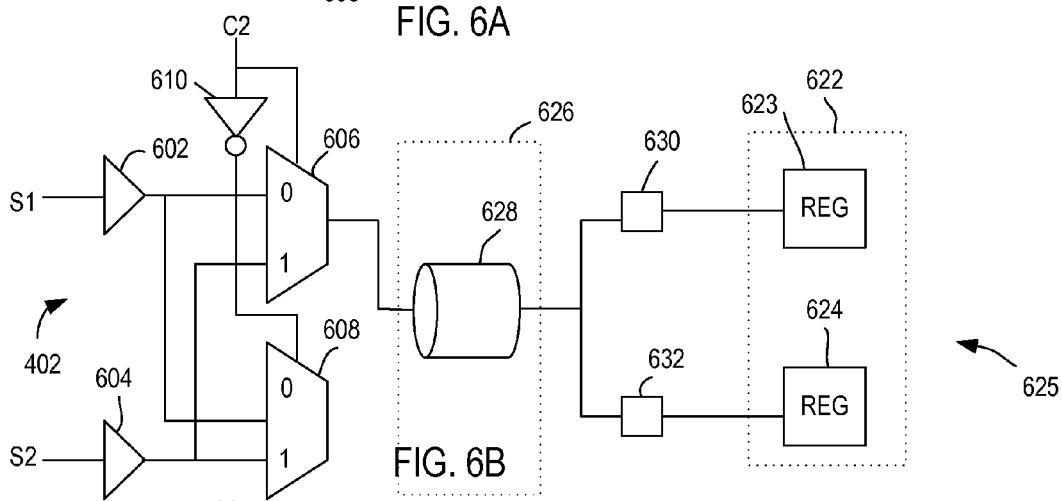
FIG. 6B is a block diagram showing another embodiment of interface logic with different TDV and inter-die contact configurations in stacked IC configuration.
Figure 6C:
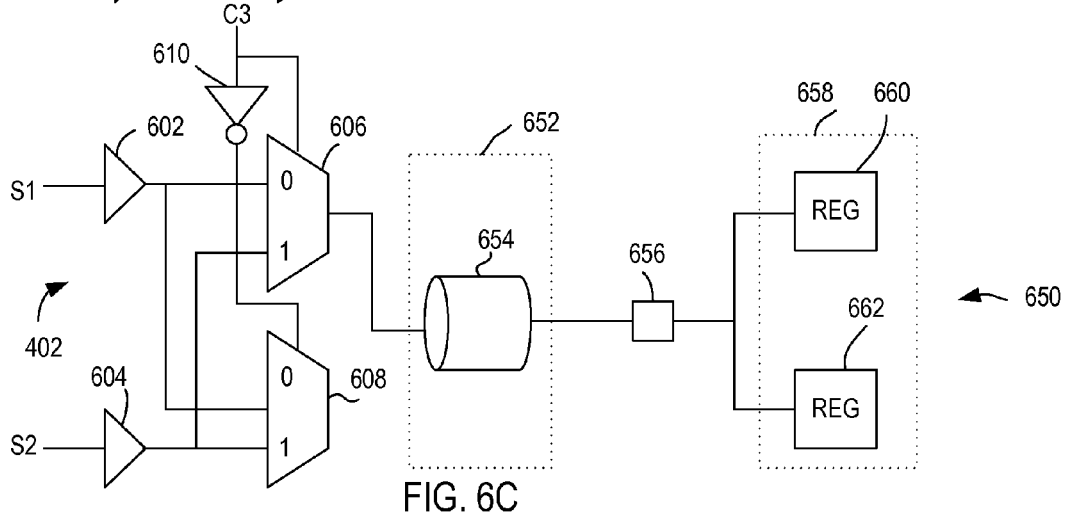
FIG. 6C is a block diagram showing another embodiment of interface logic with different TDV and inter-die contact configurations in stacked IC configuration.

FIG. 6 is a block diagram showing different embodiments of the interface logic 402 with different TDV and inter-die contact configurations in a stacked IC configuration. FIG. 6 shows three exemplary configurations 600, 625, and 650. In each of the configurations 600, 625, and 650, the interface logic 402 includes a pair of drivers 602 and 604, a pair of multiplexers 606 and 608, and a logic gate 610. Inputs of the drivers 602 and 604 are configured to receive two signals S1 and S2, respectively, to be provided from the mother IC to the daughter IC, as described above in FIGS. 4 and 5. An output of the driver 602 is coupled to an input of the multiplexer 606 and an input of the multiplexer 608. An output of the driver 604 is coupled to another input of the multiplexer 606 and another input of the multiplexer 608. The logic gate 610 comprises an inverter, the output of which is coupled to a selection port of the multiplexer 608. An input of the logic gate 610 is configured to receive a selection signal C1, which is also coupled to a selection port of the multiplexer 606.

In the configuration 600, a TDV layout 612 in the mother IC includes a pair of TDVs 614 and 616 coupled to a respective pair of inter-die contacts 618 and 620. Interface logic 622 in the daughter IC includes a pair of registers 623 and 624 respectively coupled to the pair of contacts 618 and 620. An output of the multiplexer 606 is coupled to the TDV 614, and an output of the multiplexer 608 is coupled to the TDV 616. The selection signal C1 is a clock signal that toggles between logic 0 and logic 1 at a particular frequency. In operation, when the selection signal C1 6289 is logic 0, the signal S1 is coupled to the register 623 over the TDV 614 and the signal S2 is coupled to the register 624 over the TDV 616. When the selection signal is logic 1, the signal S1 is coupled to the register 624 over the TDV 616 and the signal S2 is coupled to the register 623 over the TDV 614. Thus, both signals 51 and S2 are coupled to the daughter IC on each edge of the selection signal.

In the configuration 625, a TDV layout 626 in the mother IC includes a single TDV 628 coupled to a pair of inter-die contacts 630 and 632. The output of the multiplexer 606 is coupled to the TDV 628, and the output of the multiplexer 608 is unconnected. The selection signal C2 is a clock signal that toggles between logic 0 and logic 1 at a particular frequency. In operation, when the selection signal C2 is logic 0, the signal 51 is coupled to each of the registers 623 and 624 over the TDV 628 and the signal S2 is not coupled to the daughter IC. When the selection signal C2 is logic 1, the signal S2 is coupled to each of the registers 623 and 624 over the TDV 628, and the signal S1 is not coupled to the daughter IC. If the selection signal C2 in the configuration 625 has a frequency twice that of the selection signal C1 in the configuration 600, then data throughput is maintained. Thus, the change in TDV layout 612 to TDV layout 626 does not require a change in the electrical configuration of the interface logic 402. In addition, the TDV layout change does not require a change in the interface logic 622 in the daughter IC.

In the configuration 650, a TDV layout 652 in the mother IC includes a single TDV 654 coupled to an inter-die contact 656. Interface logic 658 in the daughter IC includes a pair of registers 660 and 662 each coupled to the inter-die contact 656. The output of the multiplexer 606 is coupled to the TDV 654, and the output of the multiplexer 608 is unconnected. The selection signal C3 is a clock signal that toggles between logic 0 and logic 1 at a particular frequency. In operation, when the selection signal C3 is logic 0, the signal S1 is coupled to each of the registers 660 and 662 over the TDV 654 and the signal S2 is not coupled to the daughter IC. When the selection signal C3 is logic 1, the signal S2 is coupled to each of the registers 660 and 662 over the TDV 654 and the signal S1 is not coupled to the daughter IC. If the selection signal C3 in the configuration 625 has a frequency twice that of the selection C1 signal in the configuration 600, then data throughput is maintained. Thus, the change in TDV layout 612 to TDV layout 626 does not require a change in the electrical configuration of the interface logic 402. Further, the change in the interface logic 658 of the daughter IC does not require a change in the electrical configuration of the interface logic 402 in the mother IC.

Figure 7:
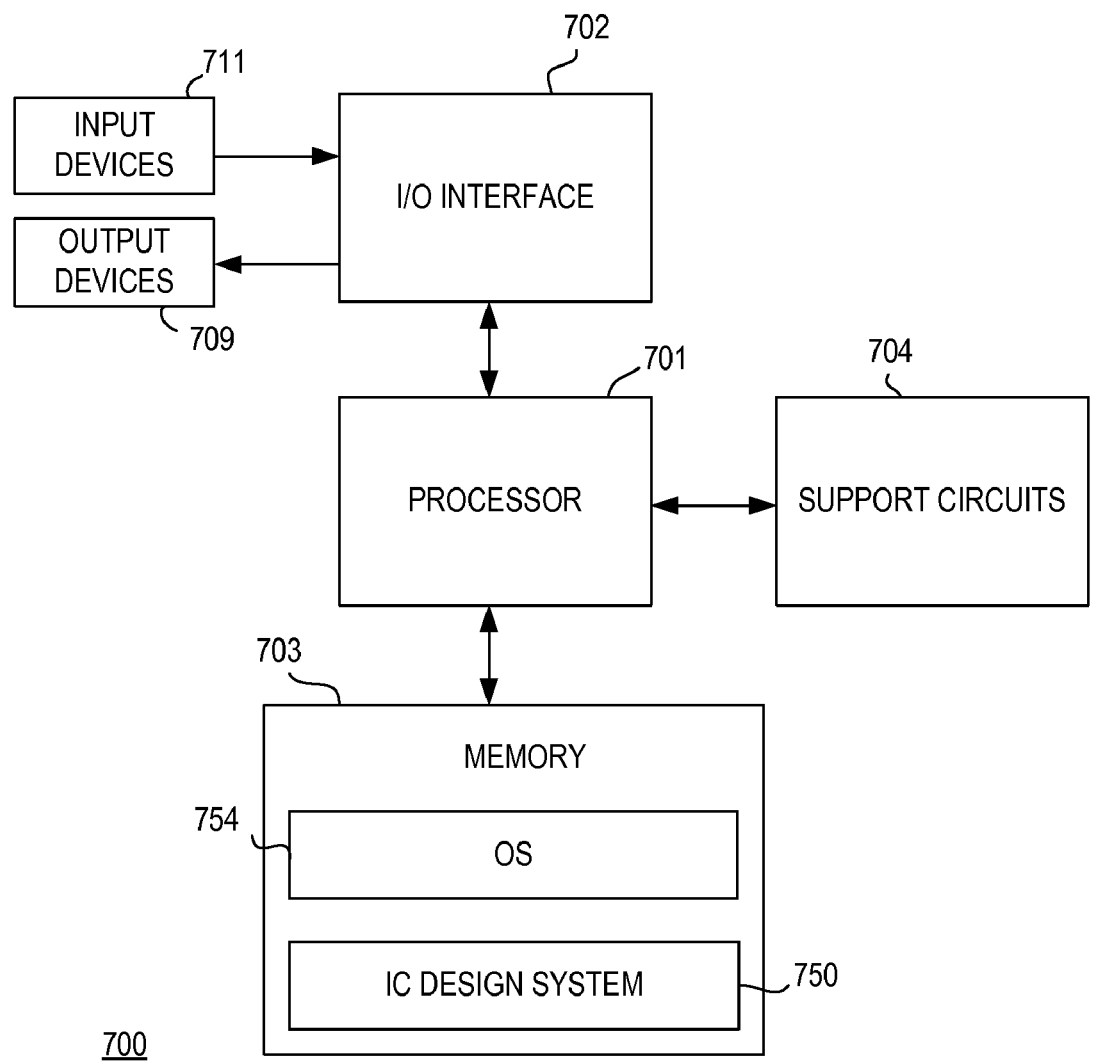
FIG. 7 is a block diagram depicting an exemplary embodiment a computer suitable for implementing the processes described herein in accordance with one or more aspects of the invention.

FIG. 7 is a block diagram depicting an exemplary embodiment a computer 700 suitable for implementing the processes described herein in accordance with one or more aspects of the invention. The computer 700 includes a processor 701, a memory 703, various support circuits 704, and an I/O interface 702. The processor 701 may include one or more microprocessors known in the art. The support circuits 704 for the processor 701 include conventional cache, power supplies, clock circuits, data registers, I/O interfaces, and the like. The I/O interface 702 may be directly coupled to the memory 703 or coupled through the processor 701. The I/O interface 702 is coupled to various input devices 711 (e.g., keyboard, mouse, and the like) and output devices 709 (e.g., display, printer, and the like).

The memory 703 may store processor-executable instructions and/or data that may be executed by and/or used by the processor 701. These processor-executable instructions may comprise hardware, firmware, software, and the like, or some combination thereof. Modules having processor-executable instructions that are stored in the memory 703 include an integrated circuit (IC) design system 750. The computer 700 may be programmed with an operating system 754, which may be any type of operating system known in the art. At least a portion of an operating system 754 may be disposed in the memory 703. The memory 703 may include one or more of the following random access memory, read only memory, magneto-resistive read/write memory, optical read/write memory, cache memory, magnetic read/write memory, and the like, as well as computer readable media as described below.

The IC design system 750 may be configured to perform the method 100 described above with respect to FIG. 1. For example, the design rules, the TDV and mother IC layout, and the mask(s) may be represented as electronic data capable of being processed by the computer 700. The IC design system can obtain the design rules (step 102), define the TDV layout in the mother IC (step 104), and define the mask(s) (step 106).

An aspect of the invention is implemented as a program product for use with a computer system. Program(s) of the program product defines functions of embodiments and can be contained on a variety of computer readable media, which include, but are not limited to: (i) information permanently stored on non-writable storage media (e.g., read-only memory devices within a computer such as CD-ROM or DVD-ROM disks readable by a CD-ROM drive or a DVD drive); and (ii) alterable information stored on writable storage media (e.g., floppy disks within a diskette drive or hard-disk drive or read/writable CD or read/writable DVD). Such computer readable media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A processor implemented method of designing a mother integrated circuit (IC) configured for stacking with at least one daughter IC, a layout of the mother IC including at least one interface tile having an electrical configuration for communicating with interface logic of the daughter IC, the processor implemented method comprising:
   obtaining, using a processor, design rules for through die vias (TDVs) to be formed in the mother IC for implementing connections between the at least one interface tile and a physical interface of the daughter IC;
   defining, using the processor, a layout of the TDVs in the mother IC according to the design rules;
   defining, using the processor, at least one mask data for configuring an interconnect on the mother IC to physically connect the TDVs between the at least one interface tile of the mother IC and the physical interface of the daughter IC; and
   determining an interface logic data for the at least one interface tile based on a configuration of the TDVs, wherein the interface logic data is for configuring the at least one interface tile to couple signals from the mother IC to the TDVs without changing the electrical configuration of the at least one interface tile.

2. The method of claim 1, wherein the interconnect comprises conductive traces on at least one interconnect layer formed on the mother IC.

3. The method of claim 2, wherein the at least one interconnect layer comprises at least one of bottom-most interconnect layers of a plurality of interconnect layers with respect to the mother IC.

4. The method of claim 2, wherein the at least one interconnect layer comprises at least one of top-most interconnect layers of a plurality of interconnect layers with respect to the mother IC.

5. The method of claim 1, wherein the design rules are established based on at least one of manufacturing process specifications for the TDVs or a pin-out configuration of the physical interface of the daughter IC.

6. The method of claim 1, wherein the at least one interface tile comprises data throughput.

7. The method of claim 6, wherein the determining the interface logic data comprises determining a data rate of the interface logic to maintain the data throughput.

8. An apparatus for designing a mother integrated circuit (IC) configured for stacking with at least one daughter IC, a layout of the mother IC including at least one interface tile having an electrical configuration for communicating with interface logic of the daughter IC, the method comprising:
- means for obtaining design rules for through die vias (TDVs) to be formed in the mother IC for implementing connections between the at least one interface tile and a physical interface of the daughter IC;
- means for defining a spatial density of the TDVs in the mother IC according to the design rules;
- means for defining at least one mask data for configuring interconnect on the mother IC to physically connect the TDVs between the at least one interface tile of the mother IC and the physical interface of the daughter IC; and
- means for determining an interface logic data for the at least one interface tile based on a configuration of the TDVs, wherein the interface logic data is for configuring the at least one interface tile to couple signals from the mother IC to the TDVs without changing the electrical configuration of the at least one interface tile.

9. The apparatus of claim 8, wherein the interconnect comprises conductive traces on at least one interconnect layer formed on the mother IC.

10. The apparatus of claim 9, wherein the at least one interconnect layer comprises at least one of bottom-most interconnect layer of a plurality of interconnect layers with respect to the mother IC.

11. The apparatus of claim 9, wherein the at least one interconnect layer comprises at least one of top-most interconnect layer of a plurality of interconnect layers with respect to the mother IC.

12. The apparatus of claim 8, wherein the design rules are established based on at least one of manufacturing process specifications for the TDVs or a pin-out configuration of the physical interface of the daughter IC.

13. The apparatus of claim 8, wherein the at least one interface tile comprises data throughput.

14. The apparatus of claim 13, wherein the means for determining the interface logic data is configured for determining a data rate of the interface logic to maintain the data throughput.

15. A non-transitory computer readable medium having instructions stored thereon that when executed by a processor cause the processor to perform a method of designing a mother integrated circuit (IC) configured for stacking with at least one daughter IC, a layout of the mother IC including at least one interface tile having an electrical configuration for communicating with interface logic of the daughter IC, the method comprising:
- obtaining design rules for through die vias (TDVs) to be formed in the mother IC for implementing connections between the at least one interface tile and a physical interface of the daughter IC;
- defining a spatial density of the TDVs in the mother IC according to the design rules;
- defining at least one mask data for configuring interconnect on the mother IC to physically connect the TDVs between the at least one interface tile of the mother IC and the physical interface of the daughter IC; and
- determining an interface logic data for the at least one interface tile based on a configuration of the TDVs, wherein the interface logic data is for configuring the at least one interface tile to couple signals from the mother IC to the TDVs without changing the electrical configuration of the at least one interface tile.

16. The computer readable medium of claim 15, wherein the interconnect comprises conductive traces on at least one interconnect layer formed on the mother IC.

17. The computer readable medium of claim 16, wherein the at least one interconnect layer comprises at least one of bottom-most interconnect layers of a plurality of interconnect layers with respect to the mother IC.

18. The computer readable medium of claim 16, wherein the at least one interconnect layer comprises at least one of top-most interconnect layers of a plurality of interconnect layers with respect to the mother IC.

19. The computer readable medium of claim 15, wherein the design rules are established based on at least one of manufacturing process specifications for the TDVs or a pin-out configuration of the physical interface of the daughter IC.

20. The computer readable medium of claim 15, wherein the at least one interface tile comprises data throughput.

* * * * *